(12) United States Patent
Karkkainen et al.

(10) Patent No.: US 7,605,408 B1
(45) Date of Patent: Oct. 20, 2009

(54) APPARATUS, METHOD AND SYSTEM FOR RECONFIGURABLE CIRCUITRY

(75) Inventors: Asta Karkkainen, Helsinki (FI); Leo Karkkainen, Helsinki (FI)

(73) Assignee: Nokia Corporation, Espoo (FI)

( * ) Notice: Subject to any disclaimer, the term of this patent is extended or adjusted under 35 U.S.C. 154(b) by 0 days.

(21) Appl. No.: 12/150,308

(22) Filed: Apr. 25, 2008

(51) Int. Cl.
H01L 29/06 (2006.01)
(52) U.S. Cl. .................. 257/209; 365/151; 977/943
(58) Field of Classification Search .......... None
See application file for complete search history.

(56) References Cited

U.S. PATENT DOCUMENTS

| | | | |
|---|---|---|---|
| 7,087,920 B1 | 8/2006 | Kamins | 257/2 |
| 2003/0142901 A1 | 7/2003 | Lahann et al. | 385/18 |
| 2005/0218398 A1 | 10/2005 | Tran | 257/14 |

OTHER PUBLICATIONS

Didiot, C., "Nanopatterning the electronic properties of gold surfaces with self-organized superlattices of metallic nanostructures," Nature Nanotechnology, vol. 2, pp. 617-621 (Sep. 23, 2007).
Ghosh, Kunal, "Electronic Band Structure of Carbon Nanotubes," Stanford University (Nov. 25, 2005).
Johnston, Hamish, "Graphene p-n junction is unveiled," http://physicsworld.com/cws/article/news/30405 (Jun. 29, 2007).
Hauptmann, J.R., "Spin-Transport in Carbon Nanotubes," Master of Science Thesis Faculty of Science, University of Copenhagen (Oct. 2, 2003).
Isacsson, A., "Electronic superlattices in corrugated graphene," http://arxiv.org/PS_cache/arxiv/pdf/0709/0709.2614v1.pdf (Sep. 17, 2007).
Minot, E.D., "Turning the Band Structure of Carbon Nanotubes," Dissertation, Cornell University, Ithaca, NY (Aug. 2004).
Park, C., et al., "Anisotropic behaviors of massless Dirac fermions in graphene under periodic potentials," Nature Physics, vol. 4, pp. 213-217 (Feb. 24, 2008).
Reich, S., "Carbon nanotubes: Vibrational and electronic properties," Dissertation, Berlin (Dec. 18, 2001).
Rycerz, A., et al., "Valley filter and valley valve in graphene," Nature Physics, vol. 3, pp. 172-175 (Feb. 18, 2007).
Silvestrov, P.G., et al., "Electrostatics of Graphene Strips," http://arxiv.org/PS_cache/arxiv/pdf/0707/0707.3463v2.pdf (Oct. 14, 2007).

(Continued)

*Primary Examiner*—Victor A Mandala
*Assistant Examiner*—Whitney Moore
(74) *Attorney, Agent, or Firm*—Ware, Fressola, Van Der Sluys & Adolphson LLP (57) ABSTRACT

The present invention relates to reconfigurable circuitry, and more particularly to the reconfiguration of the characteristics of materials used in the formation of electronic circuitry as the result of applied external influences. Exemplary embodiments of the present invention provide an apparatuses, methods, electronic devices and computer program products that include a nanoscale material layer, and a programmable element in close proximity to at least a first section of the nanoscale material layer. The programmable element is configured to produce interference with an electron wave in at least the first section of the nanoscale material layer.

37 Claims, 8 Drawing Sheets

OTHER PUBLICATIONS

Toon, John, "Carbon-Based Electronics: Researchers Develop Foundation for Circuitry and Devices Based on Graphite," Georgia Tech Research News, http://gtresearchnews.gatech.edu/newsrelease/graphene.htm (Mar. 14, 2006).

Walko, J., "Graphene transistor to rival silicon, say researchers," EE Times Europe, http://eetimes.eu/showArticle.jhtml?articleID=197700700 (Mar. 2, 2007).

Wallace, P.R., "The Band Theory of Graphite," Physical Review, vol. 71, No. 9, pp. 622-634 (May 1, 1947).

Waser, R. (Ed), "Nanoelectroncis and Information Technology: Advanced Electronic Materials and Novel Devices," pp. 475-477, Wiley-VCM, Weinhein, Germany (2003).

Williams, J.R., et al., "Quantum Hall Effect in a Gate-Controlled p-n Junction of Graphene," Science, vol. 317, pp. 638-641 (Aug. 3, 2007).

Physica E; G.I. Mark et al.; "Wave packet dynamical simulation of electron transport through a line defect on the graphene surface"; vol. 40, Issue 7, May 2008; pp. 2635-2638.

Journal of Physics and Chemistry of Solids; Y. Kobayashi et al.; "STM observation of the quantum interference effect in finite-sized graphite"; vol. 65, Issues 2-3, Mar. 2004; pp. 199-203.

Physica E; K. Harigaya et al.; "Tuning magnetism and novel electronic wave interference patterns in nanographite materials"; vol. 22, Issues 1-3, Apr. 2004; pp. 708-711.

National Board of Patents and Registration of Finland; "PCT International Search Report and Written Opinion of the International Searching Authority"; Jun. 29, 2009; whole document.

APPARATUS, METHOD AND SYSTEM FOR RECONFIGURABLE CIRCUITRY

TECHNICAL FIELD

The present invention relates to reconfigurable circuitry, and more particularly to the reconfiguration of the characteristics of materials used in the formation of electronic circuitry as the result of applied external influences.

DISCUSSION OF RELATED ART

Circuitry is shrinking in such a manner that the quantum behavior is intimately tied to the way that the circuitry must be designed. It is believed that nanotechnology will enable a significant boost in performance and power consumption of circuitry. In general, electronic circuits have separated hardware topology of wires from the currents and charges that actually convey the logic of operation. However, nanoscale systems allow for the change in the way in which electronic circuits are designed. For example, it may be beneficial to reconfigure circuitry in order to optimize performance and power consumption for computing intensive applications, such as image and speech recognition or artificial intelligence.

One type of material that may be useful in the formation of reconfigurable circuitry is a single layer of graphite, known as graphene. Graphene is a monolayer of carbon atoms with a hexagonal lattice structure. Graphene is a 2D gapless semiconductor with massless "relativistic" quasiparticles. Due to its unusual band structure, graphene is a zero-gap semiconductor with a linear energy-momentum relation near the points where valence and conduction bands meet. In general, the band structure of a solid describes ranges of energy that an electron is "forbidden" or "allowed" to have. The band structure of a particular solid is due to the diffraction of electron waves in the periodic crystal lattice of the solid. A periodic lattice of atoms, the Bravais lattice, affects an electron traveling through it by scattering the electron wave. Graphene is a Bravais lattice with a 2-atom unit cell. The scattering of the electron wave makes some values of electron velocity forbidden due to the interference of the electron wave. This interference is what creates to the band structure of a material.

Carbon atoms have six electrons that occupy the $1s^2$, $2s^2$ and $2p^2$ orbitals, the $1s^2$ electrons are tightly bound and the four $2s^2$ and $2p^2$ valence electrons are more weakly bound. In the crystalline phase these valence electrons produce the 2s, $2p_x$, $2p_y$ and $2p_z$ orbitals. Hybridization takes place between one 2s electron and two 2p electrons, which is responsible for binding the three nearest neighbor atoms in the plane. The last $p_z$ electron makes a $\pi$-orbital perpendicular to the plane. The electron in this orbital is able to move around, both in and perpendicular to the graphene plane that makes graphene a zero gap semiconductor. Due to the unique band structure of graphene it is considered promising for device applications, such as transistors.

Accordingly, aspects of the present invention are directed at producing reconfigurable circuitry through the use of applied fields to materials whose characteristics can be changed depending upon the type of applied field.

SUMMARY OF EXEMPLARY EMBODIMENTS OF THE INVENTION

The following presents a simplified summary of exemplary embodiments of the invention in order to provide a basic understanding of some exemplary aspects of the invention. This summary is not an extensive overview of the invention. It is intended to neither identify key or critical elements of the invention nor delineate the scope of the invention. Its sole purpose is to present some concepts of the invention in a simplified form as a prelude to the more detailed description that is presented later.

According to a first exemplary embodiment of the invention an apparatus is provided that may include a nanoscale material layer, and a programmable element in close proximity to at least a first section of the nanoscale material layer. The programmable element may be programmable to a first state to interfere with an electron wave in at least the first section of the nanoscale material layer in a first manner, and programmable to a second state to interfere with the electron wave in a second manner.

In accordance with the first exemplary embodiment of the invention, the nanoscale material layer may include a layer of graphene.

In accordance with the first exemplary embodiment of the invention, the first state or the second state of the programmable element may include a first nanoscale charge distribution.

In accordance with the first exemplary embodiment of the invention, the interference from the first nanoscale charge distribution may be configured to produce a metallic state in at least the first section of the layer of graphene.

In accordance with the first exemplary embodiment of the invention, the interference from the first nanoscale charge distribution may be configured to produce a semiconducting state in at least the first section of the layer of graphene.

In accordance with the first exemplary embodiment of the invention, the interference from the first nanoscale charge distribution may be configured to produce an insulating state in at least the first section of the layer of graphene.

In accordance with the first exemplary embodiment of the invention, the programmable element is dynamically reconfigurable from the first state to the second state.

In accordance with the first exemplary embodiment of the invention, the first state or the second state may include a second nanoscale charge distribution.

In accordance with the first exemplary embodiment of the invention, the first nanoscale charge distribution may be printed on the programmable element by a laser printer.

In accordance with the first exemplary embodiment of the invention, the first nanoscale charge distribution may be printed on the programmable element by e-beam lithography.

In accordance with the first exemplary embodiment of the invention, the semiconducting state may be n-type.

In accordance with the first exemplary embodiment of the invention, the semiconducting state may be p-type.

In accordance with the first exemplary embodiment of the invention, the apparatus may also include a first contact coupled to a first edge of the layer of graphene, and a second contact coupled to a second edge of the layer of graphene.

In accordance with the first exemplary embodiment of the invention, the first nanoscale charge distribution may be a periodic electric charge distribution.

In accordance with the first exemplary embodiment of the invention, the programmable element may include an insulator material.

In accordance with the first exemplary embodiment of the invention, the nanoscale material layer may include a layer of homogenous magnetic tunnel junctions.

In accordance with the first exemplary embodiment of the invention, the programmable element may include an applied magnetic field.

In accordance with the first exemplary embodiment of the invention, the interference from the applied magnetic field may be configured to produce a metallic state in at least the first section of the layer of homogenous magnetic tunnel junctions.

In accordance with the first exemplary embodiment of the invention, the interference from the applied magnetic field may be configured to produce a semiconducting state in at least the first section of the layer of homogenous magnetic tunnel junctions.

In accordance with the first exemplary embodiment of the invention, the interference from the applied magnetic field may be configured to produce an insulating state in at least the first section of the layer of homogenous magnetic tunnel junctions.

In accordance with the first exemplary embodiment of the invention, the applied magnetic field may be dynamically reconfigurable.

According to a second exemplary embodiment of the invention, a method is provided that may include providing a nanoscale material layer, and providing a programmable element in close proximity to at least a first section of the nanoscale material layer. The programmable element is programmable to a first state to interfere with an electron wave in at least the first section of the nanoscale material layer in a first manner, and programmable to a second state to interfere with the electron wave in a second manner.

In accordance with the second exemplary embodiment of the invention, the nanoscale material layer includes a layer of graphene.

In accordance with the second exemplary embodiment of the invention, the method may also include providing the programmable element with a first nanoscale charge distribution corresponding to either the first state or the second state.

In accordance with the second exemplary embodiment of the invention, the interference from the first nanoscale charge distribution may be configured to produce a metallic state in at least the first section of the layer of graphene.

In accordance with the second exemplary embodiment of the invention, the interference from the first nanoscale charge distribution may be configured to produce a semiconducting state in at least the first section of the layer of graphene.

In accordance with the second exemplary embodiment of the invention, the interference from the first nanoscale charge distribution may be configured to produce an insulating state in at least the first section of the layer of graphene.

In accordance with the second exemplary embodiment of the invention, the method may also include reconfiguring the programmable element from the first state to the second state.

In accordance with the second exemplary embodiment of the invention, the method may also include providing the first state or the second state with a second nanoscale charge distribution.

In accordance with the second exemplary embodiment of the invention, the method may also include printing the first nanoscale charge distribution on the programmable element by a laser printer.

In accordance with the second exemplary embodiment of the invention, the method may also include printing the first nanoscale charge distribution on the programmable element by e-beam lithography.

In accordance with the second exemplary embodiment of the invention, the first nanoscale charge distribution may be a periodic electric charge distribution.

In accordance with the second exemplary embodiment of the invention, the nanoscale material layer may include a layer of homogenous magnetic tunnel junctions.

In accordance with the second exemplary embodiment of the invention, the programmable element may include an applied magnetic field.

According to a third exemplary embodiment of the invention, an electronic device is provided and may include a reconfigurable circuitry component that may include a nanoscale material layer, and a programmable element in close proximity to at least a first section of the nanoscale material layer that may include a first nanoscale charge distribution. The programmable element may be programmable to a first state to interfere with an electron wave in at least the first section of the nanoscale material layer in a first manner, and programmable to a second state to interfere with the electron wave in a second manner. The electronic device may also include a processing component configured to dynamically change the first nanoscale charge distribution to a second nanoscale charge distribution.

In accordance with the third exemplary embodiment of the invention, the nanoscale material layer may include a layer of graphene.

According to a fourth exemplary embodiment of the invention, a computer readable storage medium embedded with a computer program including programming code is provided for receiving instructions to erase a first nanoscale charge distribution from a programmable element, erasing the first nanoscale charge distribution from the programmable element, and writing a new nanoscale charge distribution to the programmable element. The programmable element is in close proximity to at least a first section of a nanoscale material layer.

BRIEF DESCRIPTION OF THE DRAWINGS

The above and other objects, features and advantages of the invention will become apparent from a consideration of the subsequent detailed description presented in connection with accompanying drawings, in which.

DETAILED DESCRIPTION OF THE INVENTION

The present invention now will be described more fully hereinafter with reference to the accompanying figures, in which exemplary embodiments of the invention are shown. The invention may, however, be embodied in many different forms and should not be construed as limited to the embodiments set forth herein.

The present invention is generally related to dynamically tuning a material in order to alter the characteristics of the material so that the material will behave as a transistor, conductor and/or insulator depending upon an external force of influence, for example an applied electric or magnetic field. It is possible to alter the external force or influence, so that depending upon the force or influence applied the same section of the material may behave as a transistor, conductor and/or insulator. Therefore, the material will be reconfigurable based upon the external force or influence applied to the material.

An exemplary embodiment of the present invention involves creating a periodic potential through the use of an applied external electric field that scatters electron waves propagating through a layer of reconfigurable nanoscale material, such as graphene. In this exemplary embodiment of the invention, the reconfigurable material is a layer of graphene, and the external influence is an external electric field created by a dynamically reconfigurable charge pattern. The external electric field is external in the sense that it is external to the layer of graphene, but within close enough proximity to the layer of graphene to create the periodic potential within the layer of graphene. The external electric field can create a superlattice depending upon the type of electric field applied to the layer of graphene. Restriction of k-values caused by the superlattice is referred to as a miniband structure. Transport of electrons through the layer of graphene will therefore depend upon the miniband structure of the superlattice, which as mentioned above, depends upon the type of electric field applied to the layer of graphene. For example, if an additional periodic potential is applied to graphene, and the spatial period of the superlattice potential is larger than the nearest-neighbor carbon-carbon distance in graphene the scattering of a state close to one Dirac point (K or K') in the Brillouin zone to another one does not occur. The transport properties of electrons through graphene can thereby be altered by the influence of the applied external electric field. In addition, since it is possible to change the charge pattern of the electric field, it is thereby possible to change the transport properties of different portions of the graphene layer based on the charge pattern employed in the external electric field.

The charge pattern may be changed through the use of non-volatile computer memory that can be electrically erased and reprogrammed, for example electrically erasable programmable read-only memory (EEPROM) or flash memory. The layer of graphene may be placed on top of or below the non-volatile computer memory that can be electrically erased and reprogrammed, and insulated islands of charge can be erased or charged in a similar manner as the writing of memory to a chip. It is also possible to produce stable charge patterns on a surface through the use of self assembly in a structure.

For example, a section of the layer of graphene may be exposed to a particular external electric field that produces interference in the electron wave causing that section of the layer of graphene to be semiconducting. The periodic potential created by the external electric field can act in an analogous way as the periodic electric field from the atoms in the layer of graphene. Removal of that external electric field, or exposure of that section of the layer of graphene to a different external electrical field, may then result in a change in the characteristics of that section of the layer of graphene from semiconducting to metallic. Therefore, by exposing particular sections of the layer of graphene to external electric fields it is possible to configure different sections of the graphene layer to be either conducting, resistive or semiconducting. It is also possible to configure the same section of the graphene layer to be conducting or semiconducting depending upon the external electric field applied in proximity to that section of the graphene layer.

Figure 1:
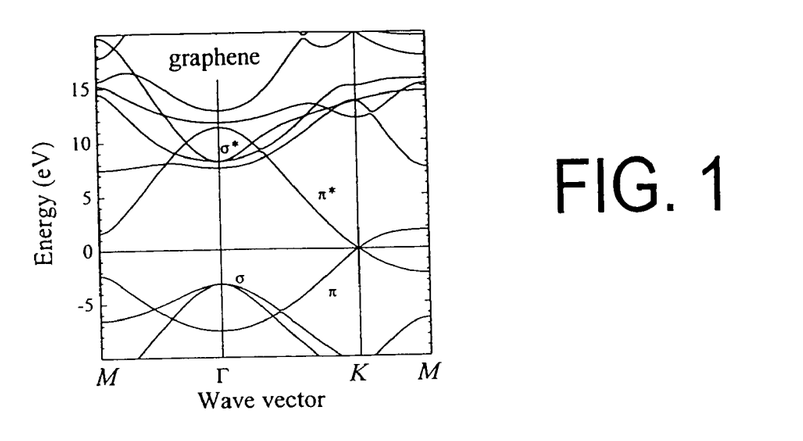
FIG. 1 shows the band structure of graphene.
Figure 2:
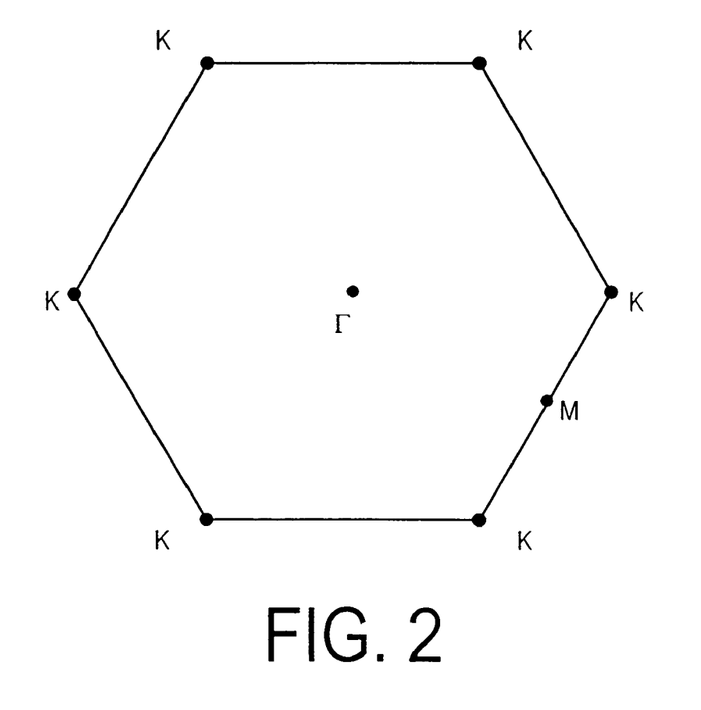
FIG. 2 shows the Brillouin zone for graphene.

FIG. 1 shows the electronic band structure of a layer of graphene in the absence of an applied external electric field. FIG. 2 shows the reciprocal lattice point and the Brillouin zone for graphene. In FIG. 1 π denotes a bonding band, and π* denotes an anti-bonding band. The bonding band may also be referred to as the valence band, and the anti-bonding band may also be referred to as the conduction band. The 2D energy states of the π-electrons in the graphene plane can be expressed as a function of wave vectors $k_x$ and $k_y$, which was derived in P. R. Wallace, The Band Theory of Graphite, Phy. Rev. 71(9) (1947) which is hereby incorporated by reference in its entirety. The function can be stated as:

$$w_{2D}(k_x, k_y) = \pm\gamma_0\left[1 + 4\cos\left(\frac{\sqrt{3}k_x a}{2}\right)\cos\left(\frac{k_y a}{2}\right) + 4\cos\left(\frac{k_y a}{2}\right)^2\right]^{1/2}$$

$\gamma_o$ represents the nearest-neighbor overlap integral, and $\alpha$=0.246 nm as the in-plane lattice constant.

Figure 3:
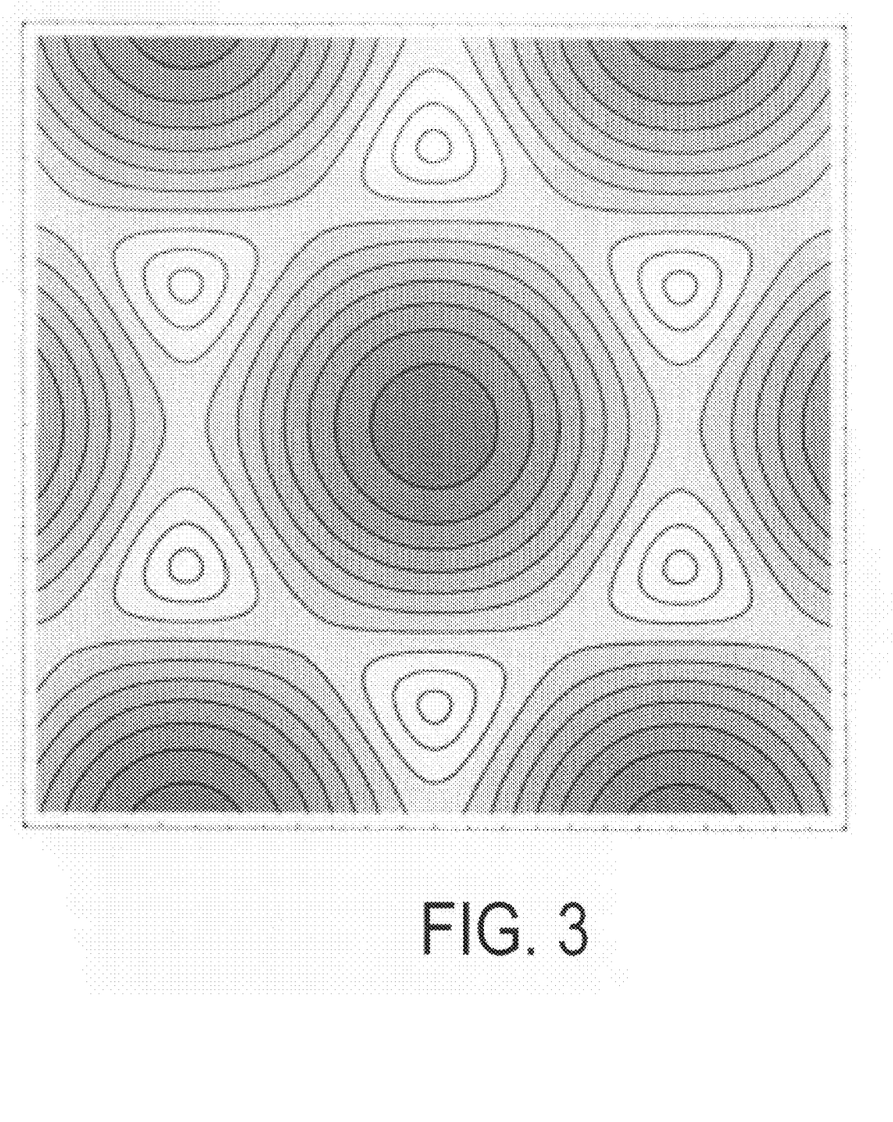
FIG. 3 shows a contour plot representation of the valence state energy for the layer of graphene.

As shown in FIG. 1 the bonding and anti-bonding electronic bands touch at the K-points on the corners of the Brillouin zone. At the K-point crossing of the valence and conduction bands occurs, and therefore the conduction and valence states are degenerate. FIG. 3 shows a contour plot representation of the valence state energy for the layer of graphene. In FIG. 3, lower energies are shaded darker. As shown in FIG. 3, the circular white contours represent the six K-points, and the hexagon formed by the six K-points define the Brillouin zone as shown in FIG. 2. The K-point may also be referred to as the Fermi points for graphene. The dispersion relation beyond the Brillouin zone repeats as demonstrated in FIG. 3.

Figure 4:
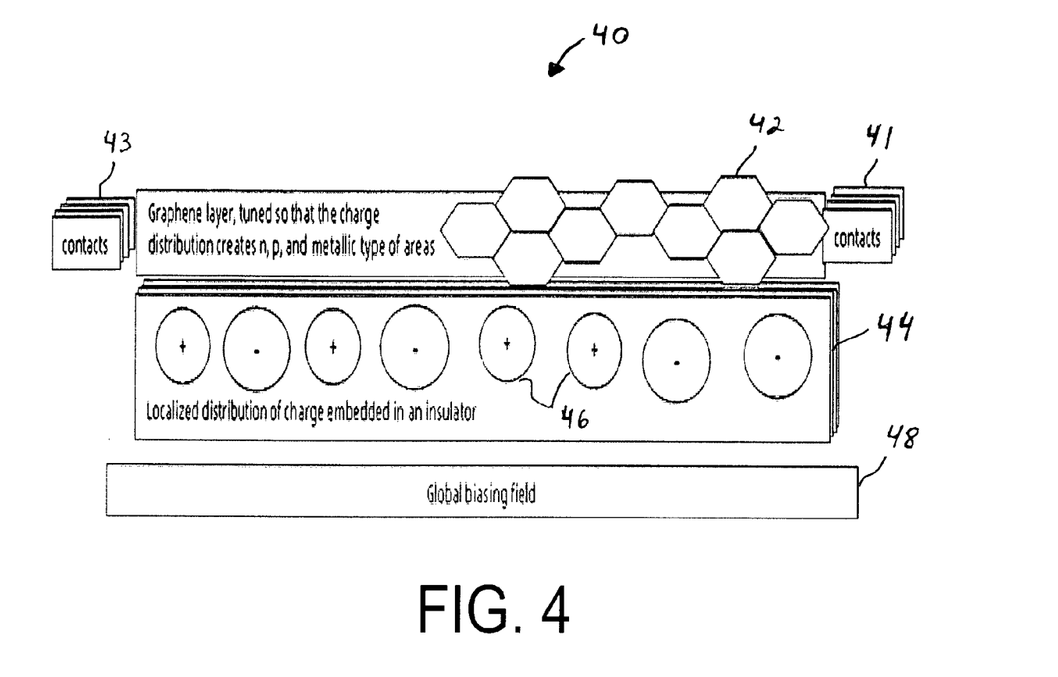
FIG. 4 shows an exemplary embodiment of the present invention showing a configuration that may be used to dynamically alter the characteristics of a layer of graphene.

FIG. 4 shows one exemplary configuration 40 of a layer of graphene 42 placed in close proximity to an external electric field in the form of a particular charge pattern 46. The charge pattern 46 may be either above or below the layer of graphene 42 in order to alter the electrical characteristics of the layer of graphene 42 to define what parts of the layer of graphene 42 are conducting, resistive or semiconducting. The charge pattern 46 may be printed on a substrate with a laser printer or a polymer by e-beam lithography in order to form predefined electrostatic charge distribution. An exemplary insulator material 44 may be formed using atomic layer deposition to deposit successive layers of nitrogen oxide, trimethylaluminum, and aluminum oxide. The charge pattern 46 may be a nanoscale charge distribution, and may be altered dynamically so that sections of the layers of graphene 42 can be semiconducting, conducting or insulating depending upon the charge patter 46. The layer of graphene 42 is interposed between a first set 41 and second set 43 of contacts. The configuration 40 of FIG. 4 may also include a global biasing field 48. The global biasing field 48 may be used to shut down a device including the configuration 40 instantly for power saving purposes, or to put the device into a hold state either entirely or in particular functional areas.

Figure 5:
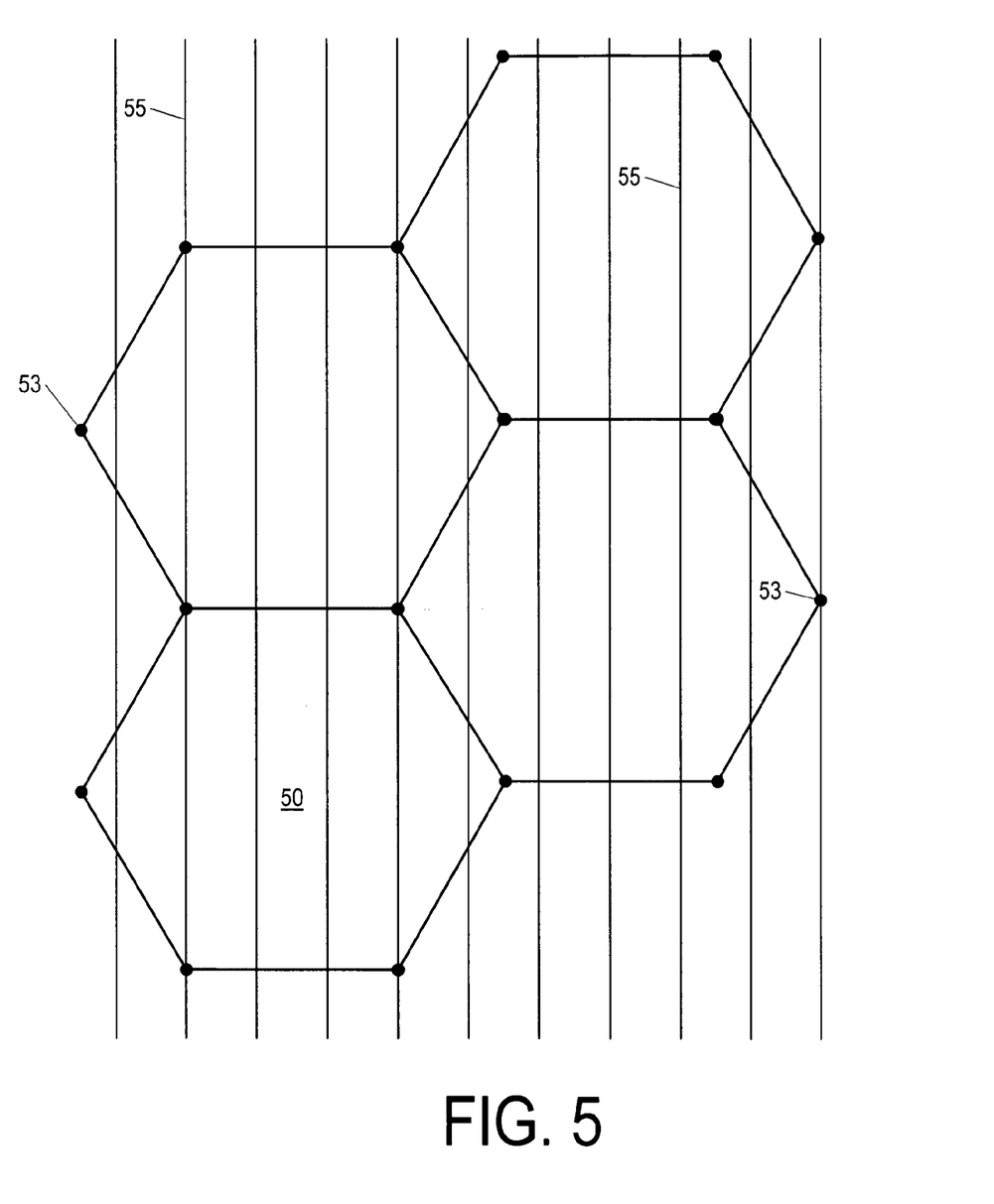
FIG. 5 shows an exemplary embodiment of the present invention in which the layer of graphene exhibits conducting characteristics.

The configuration 40 shown in FIG. 4 may be used to reconfigure the characteristics of the layer of graphene 42 depending upon the charge pattern 46 applied to the layer of graphene 42. Since the band structure of graphene results in a layer of graphene being conducting no particular charge pattern is required in order to impart metallic properties to a section or sections of the layer of graphene 42. Therefore, in the absence of a charge pattern the layer of graphene 42 may act as the wire or gate of a transistor. Even in the presence of a charge pattern a section or sections of the layer of graphene 42 may still exhibit metallic characteristics, which will be dependent upon whether the charge pattern 46 is sufficient to interfere with the electron waves propagating through that section or sections of the layer of graphene 42. FIG. 5 shows a set of Brillouin zones 50 for graphene. The parallel lines 55 in FIG. 5 represent the electron waves propagating through the Brillouin zones 50. The parallel lines 55 correspond to the allowed k-values in the layer of graphene. The restriction, or potential in one dimension in graphene, constrains the allowed k-values to lines. Since there is no interference or limited interference from the charge pattern, the allowed k-values pass through the K-points 53 of the Brillouin zone for the layer of graphene. This means that the valence and conduction bands cross, and the layer of graphene will be conducting.

Figure 6:
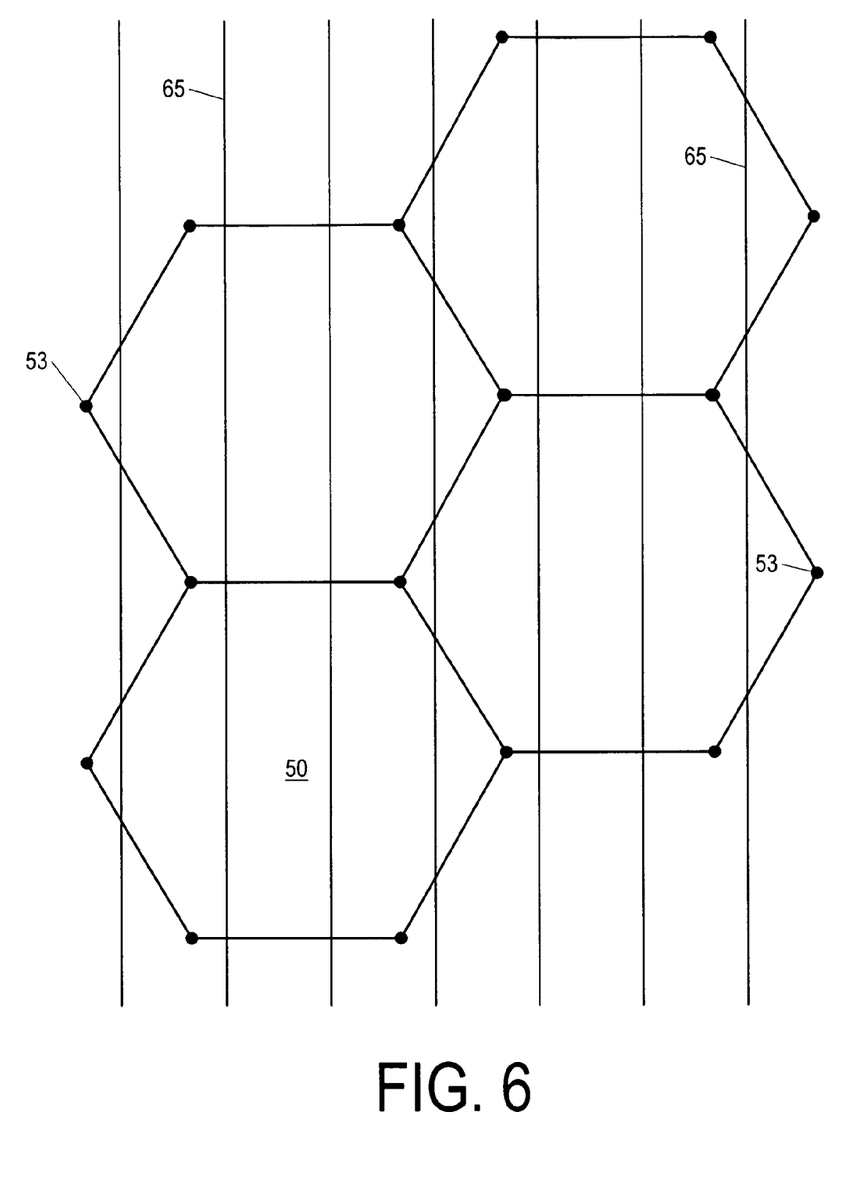
FIG. 6 shows an exemplary embodiment of the present invention in which the layer of graphene exhibits semiconducting characteristics.

By applying the charge pattern 46 close enough to the layer of graphene 42 it is possible to create potential barriers that interfere with the electron waves passing through the layer of graphene 42. The periodic electric field created by the charge distribution of the charge pattern 46 is brought close enough to the 2D lattice of graphene to coherently interfere with the electron waves. This is due to the ballistic nature of graphene. The electron waves scattered by the potential barriers created by the charge pattern may then interfere with itself producing k-values that are forbidden. Similar to the way the structure of a carbon nanotube restricts k-values, interference of the electron wave reflecting from the boundary is also caused by electron wave scattering by the charge pattern 46 producing external electric field fronts that are periodically placed. Therefore, there will be some values of the electron velocity that are forbidden as a result of the influence of the charge pattern 46. A charge pattern may be selected such that a quasilattice in the layer of graphene 42 is created in which the Fermi point k-value is forbidden. The interference caused by the charge pattern 46 and the electron wave itself is such that it is not possible for the electron wave to pass through the Fermi point of the Brillouin zone of the layer of graphene. In this instance, since the Fermi point k-value is forbidden the section or sections of the layer of graphene exposed to the charge pattern will be semiconducting. The quantum well done by restricting graphene to a ribbon is a square potential. In the tight binding calculation this potential has to be Fourier-transformed to k-space, which turns the potential to a sum of Fourier components. Each of these Fourier components is a periodic potential that creates interference for the electron wave. The square wave can be made out of sine waves, and the relevant component is the sine wave that is close to the Fermi point of the Brillouin zone of graphene. Therefore, the charge distribution of the charge pattern may have a periodicity that creates interference for the electron wave. FIG. 6 shows the set of Brillouin zones 50 for graphene in combination with parallel lines 65 representing electron waves influenced by the charge pattern. The parallel lines 65 represent the allowed k-values. All other points are forbidden as a result of the interference caused by the charge pattern and the electron itself. As shown in FIG. 6, none of the parallel lines 65 pass through the K-points 53 of the Brillouin zone for the layer of graphene since the k-values for the K-points 53 are forbidden. There will be no conducting electrons in the graphene when the forbidden k-values reside on the Fermi point, and therefore the section or sections of the layer of graphene exposed to the charge pattern will be semiconducting.

With particular charge patterns 46 the section or sections of the layer of graphene 42 may exhibit the characteristics of a p-type semiconductor, and with other charge patterns 46 the section or sections of the layer of graphene 42 may exhibit the characteristics of an n-type semiconductor. In accordance with an embodiment of the invention positive and negative charge patterns are placed in close proximity to the layer of graphene 42. The positive charge pattern attracts electrons in the region of the graphene layer in close proximity to the positive charge pattern, thereby creating an area of excess negative charge resulting in a n-type semiconductor in the layer of graphene. The negative charge pattern repels electrons in the region of the graphene layer in close proximity to the negative charge pattern, thereby creating an area of excess positive charge resulting in a p-type semiconductor. Therefore, the layer of graphene may have p-type and n-type regions within a well defined p-n junction in the area of the positive and negative charge patterns.

In accordance with another exemplary embodiment of the invention it is possible to expose the graphene layer 42 to a particular charge pattern 46 so that a section or sections of the graphene layer 42 exhibit insulator or resistor characteristics. In one embodiment of the invention resistor characteristics are produced in a section of sections of graphene by applying a similar charge pattern as used to produce semiconducting characteristics and cooling the configuration 40 to an appropriate temperature. Another way to produce resistor characteristics is to cause interference of two or more different metallic paths so that the electron paths cancel. There is sufficient coherence in the electron wave propagating through graphene to form these forbidden structures.

The configuration 40 shown in FIG. 4 may also include or be in operational communication with software, a computer readable medium or storage structure, a computer program produce, and/or a computer program or program code (not shown) that is configured to receive instructions to erase the current charge pattern 46 employed in the configuration 40. The program code may also be configured to erase the current charge pattern 46, and receive instructions regarding a new charge pattern, and write the new charge pattern (not shown) onto the insulator material 44. In this manner is it possible to produce a reconfigurable graphene layer based upon the charge pattern that is applied to the graphene layer. The graphene characteristics will then be altered by the charge distribution of the external electric field applied to the graphene. Circuits can be formed from the graphene layer based on the charge distributions, and the charge distributions can be dynamically programmed and erased after production to redefine the functionality of the circuits. The above mentioned alterations using charge patterns are applicable to more than one layer of graphene.

Figure 7:
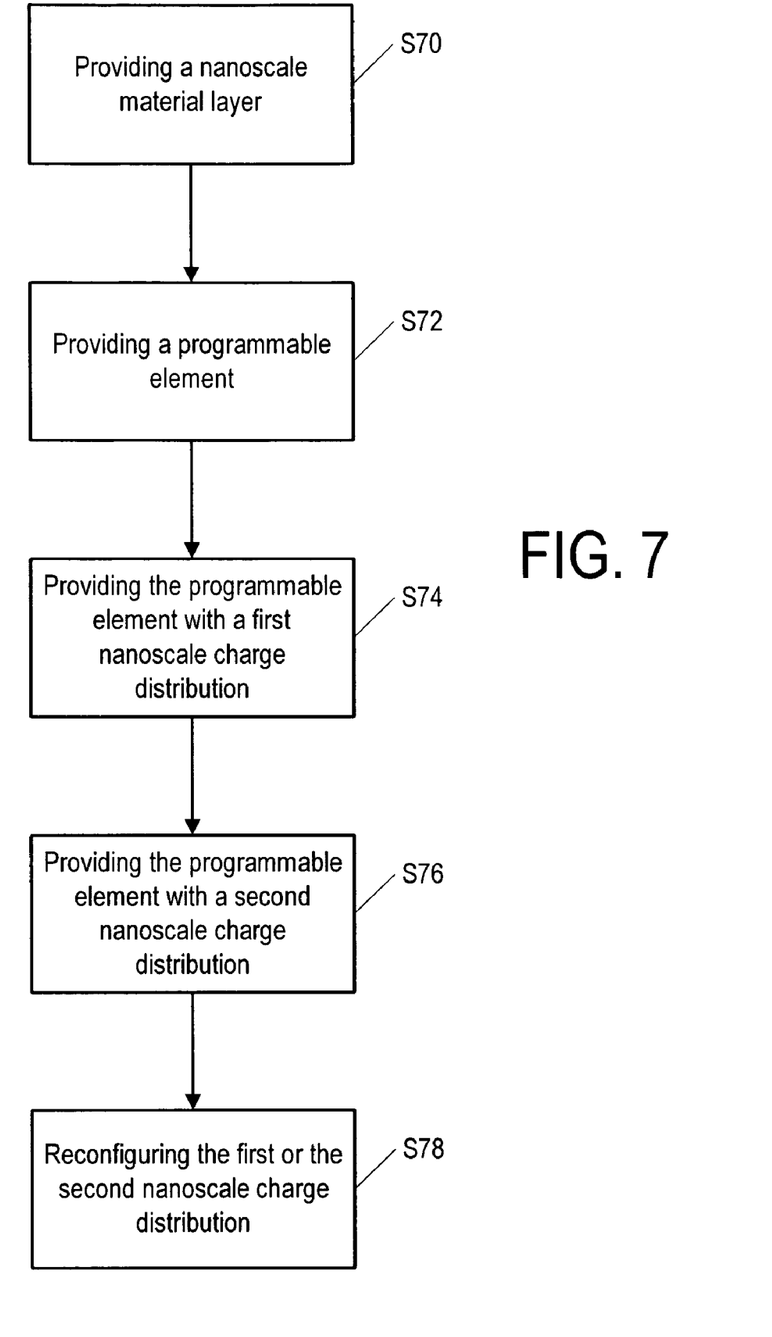
FIG. 7 shows an exemplary method according to an aspect of the invention.

FIG. 7 shows an exemplary method according to an aspect of the invention. The method may include a step S70 of providing a nanoscale material layer. The nanoscale material layer may be comprised of a layer of graphene or a layer of magnetic tunnel junctions. The method may also include a step S72 of providing a programmable element in close proximity to the nanoscale material layer. The programmable element is configured to produce interference with an electron wave in at least a first section of the nanoscale material layer. The programmable element may be comprised of an insulator material or an applied magnetic field. The method of FIG. 7 may also include a step S74 of providing the programmable element with a first nanoscale charge distribution. The interference from the first nanoscale charge distribution may be configured to produce a metallic state in at least the first section of the nanoscale material layer. In addition, the interference from the first nanoscale charge distribution may be configured to produce a semiconducting state in at least the first section of the nanoscale material layer. Furthermore, interference from the first nanoscale charge distribution may be configured to produce an insulating state in at least the first section of the nanoscale material layer. The method may also include a step S76 of providing the programmable element with a second nanoscale charge distribution. Providing the programmable element with the first or second nanoscale charge distribution may include printing the first or second charge distribution on the programmable element by a laser printer or e-beam lithography. The second nanoscale charge distribution may be configured to produce the same states as the first nanoscale charge distribution in the nanoscale material layer. The method shown in FIG. 7 may also include reconfiguring the first or the second nanoscale charge distribution. Various steps of the method shown in FIG. 7 can be performed out of order, some steps can maybe even be omitted, and no particular order is required.

Figure 8:
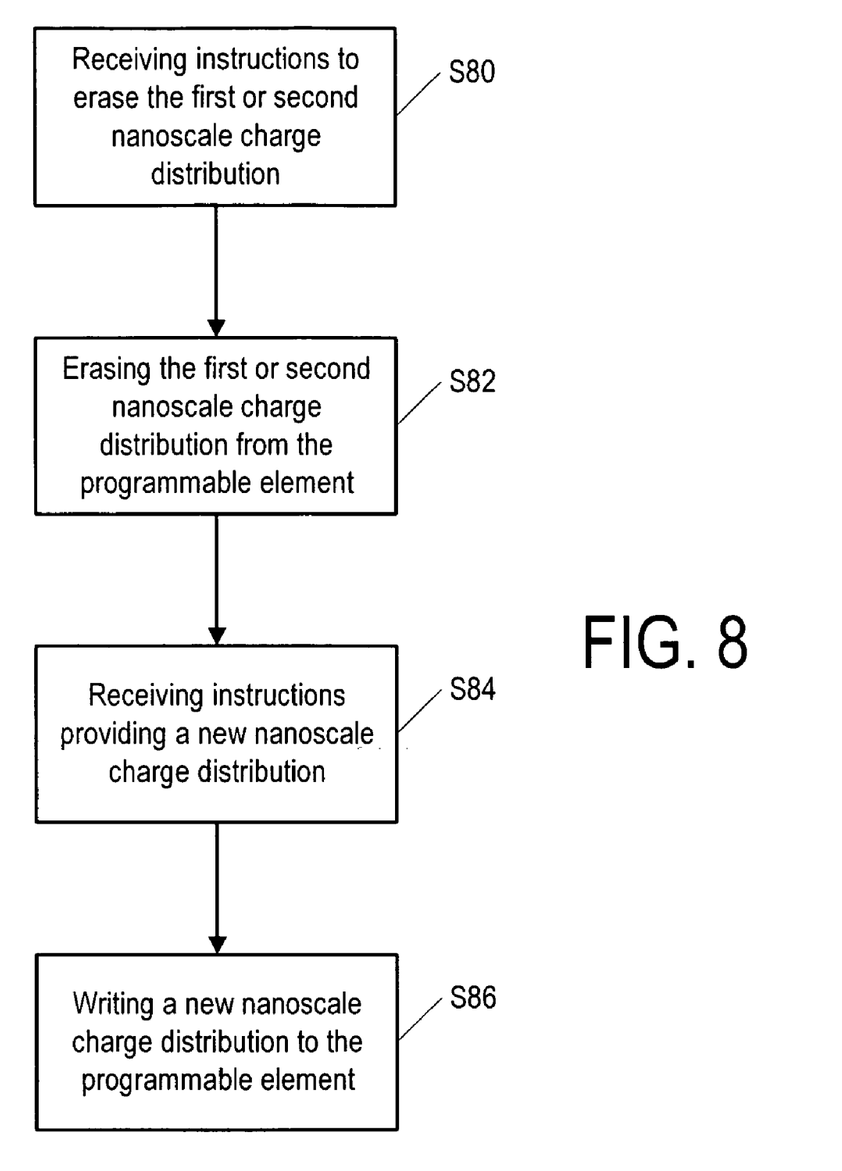
FIG. 8 shows an exemplary method according to an aspect of the invention.

FIG. 8 shows an exemplary method according to an aspect of the invention that includes steps that may be performing during step S78 of FIG. 7. The method of FIG. 8 may include a step S80 of receiving instructions to erase the first or second nanoscale charge distribution. The method may also include a step S82 of erasing the first or second nanoscale charge distribution from the programmable element. The method may further include a step S84 of receiving instructions providing a new nanoscale charge distribution, and a step S86 of writing the new nanoscale charge distribution to the programmable element. Various steps of the method shown in FIG. 8 can be performed out of order, some steps can maybe even be omitted, and no particular order is required. The methods shown in FIGS. 7 and 8 may be implemented through the use of hardware, software, computer readable mediums containing computer program products, or computer readable storage mediums embedded with a computer program comprising programming code for performing some or all of the steps shown in FIGS. 7 and 8.

In another exemplary embodiment of the invention, the reconfigurable material may be comprised of a matrix of magnetic tunnel junctions, and the external force or influence is an external magnetic field. A magnetic tunnel junction includes two layers of magnetic material, for example cobalt-iron, separated by an ultrathin insulator layer. The insulator layer may be made from aluminum oxide and have a thickness of approximately 1 nm. The insulator layer should be thin enough so that electrons are capable of tunneling through the insulator layer if a bias voltage is applied between the two layers of magnetic material. The two layers of magnetic material may be the metal electrodes. In the magnetic tunnel junction the tunneling current is dependent upon the relative orientation of magnetizations of the two magnetic layers, which can be changed by an applied magnetic field. In this embodiment of the invention a homogenous surface of magnetic tunneling junctions can be tuned to different resistances by a permanent back plate pattern, which forms areas of resistance and conductance in the surface of magnetic tunneling junctions. In order to produce different areas of resistance and conductance a magnetic domain must be provided along with sufficient current below the surface of the magnetic tunneling junctions. In this manner it is possible to dynamically tune the surface of magnetic tunneling junctions to produce a transistor, conductor and/or insulator.

Figure 9:
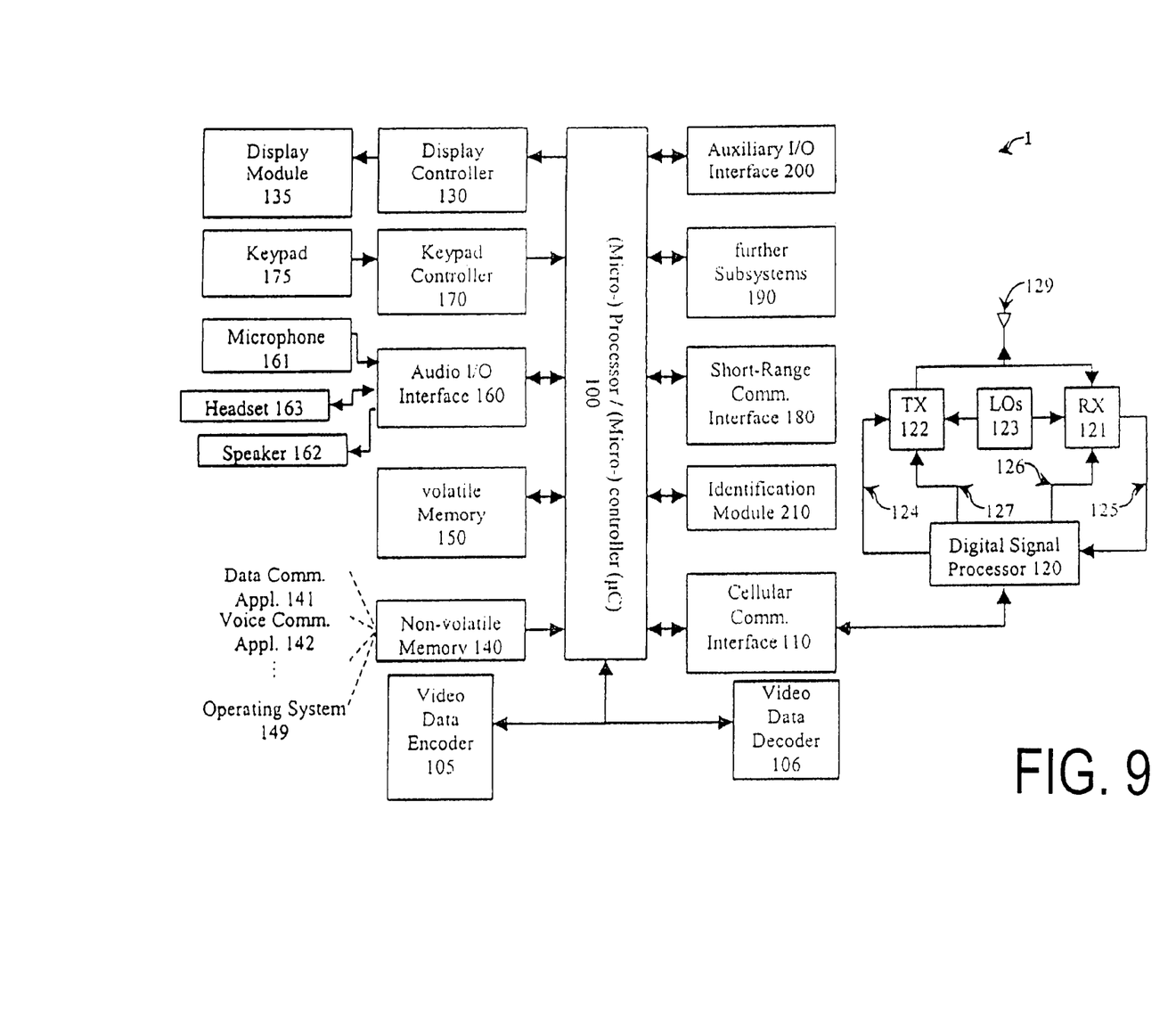
FIG. 9 shows an exemplary embodiment of components for an electronic device that may be comprised of the configuration shown in FIG. 4.

FIG. 9 depicts exemplary components of an electronic device 1 that may be comprised of the configuration 40 of FIG. 4. The configuration 40 of FIG. 4 may be reconfigured to perform different functions and to take on different characteristics of circuitry components. Therefore, to the extent that the components of the electronic device 1 are implemented in the form of circuitry or other electronic transmission devices, the components may be implemented at least in part using the configuration 40 of FIG. 4. The electronic device 1 shown in FIG. 9 may be capable of data and voice communications, for example the electronic device 1 may be a mobile phone, computer, personal data assistant (PDA), or the like. It should be noted that the exemplary embodiments are not limited to these embodiments, which represent some of a multiplicity of different embodiments since electronic device may be any sort of electronic device. The electronic device 1 may include a microprocessor or microcontroller 100 as well as components associated with the microprocessor controlling the operation of the electronic device 1. These components may include a display controller 130 connecting to a display module 135, a non-volatile memory 140, a volatile memory 150 such as a random access memory (RAM), an audio input/output (I/O) interface 160 connecting to a microphone 161, a speaker 162 and/or a headset 163, a keypad controller 170 connected to a keypad 175 or keyboard, any auxiliary input/output (I/O) interface 200, and a short-range communications interface 180. The electronic device 1 may also include other device subsystems shown generally at 190.

The electronic device 1 may include a communication interface subsystem that may include a cellular interface 110, a digital signal processor (DSP) 120, a receiver (RX) 121, a transmitter (TX) 122, and one or more local oscillators (LOs) 123 and enables the communication with one or more networks, for example a public land mobile network (PLMN). The digital signal processor (DSP) 120 sends communication signals 124 to the transmitter (TX) 122 and receives communication signals 125 from the receiver (RX) 121. In addition to processing communication signals, the digital signal processor 120 also provides for the receiver control signals 126 and transmitter control signal 127. For example, besides the modulation and demodulation of the signals to be transmitted and signals received, respectively, the gain levels applied to communication signals in the receiver (RX) 121 and transmitter (TX) 122 may be adaptively controlled through automatic gain control algorithms implemented in the digital signal processor (DSP) 120. Other transceiver control algorithms could also be implemented in the digital signal processor (DSP) 120 in order to provide more sophisticated control of the receiver 121 and/or transmitter 122.

After any required network registration or activation procedures, which may involve a subscriber identification module (SIM) 210 required for registration in wireless networks, have been completed, the electronic device 1 may then send and receive communication signals, including both voice and data signals, over the wireless network. Signals received by an antenna 129 from the wireless network are routed to the receiver 121, which provides for such operations as signal amplification, frequency down conversion, filtering, channel selection, and analog to digital conversion. Analog to digital conversion of a received signal allows more complex communication functions, such as digital demodulation and decoding, to be performed using the digital signal processor (DSP) 120. In a similar manner, signals to be transmitted to the wireless network are processed, including modulation and encoding, for example, by the digital signal processor (DSP) 120 and are then provided to the transmitter 122 for digital to analog conversion, frequency up conversion, filtering, amplification, and transmission to the wireless network via the antenna 129.

The microprocessor/microcontroller (µC) 110, which may also be designated as a device platform microprocessor, may manage the functions of the electronic device 1. Operating system software 149 used by the processor 110 may be stored in a persistent store such as the non-volatile memory 140, which may be implemented, for example, as a Flash memory, battery backed-up RAM, any other non-volatile storage technology, or any combination thereof. In addition to the operating system 149, which controls low-level functions as well as (graphical) basic user interface functions of the electronic device 1, the non-volatile memory 140 may include a plurality of high-level software application programs or modules, such as a voice communication software application 142, a data communication software application 141, an organizer module (not shown), or any other type of software module (not shown). These modules are executed by the processor 100 and provide a high-level interface between a user of the electronic device 1 and the electronic device 1. This interface typically includes a graphical component provided through the display 135 controlled by a display controller 130 and input/output components provided through a keypad 175 connected via a keypad controller 170 to the processor 100, an auxiliary input/output (I/O) interface 200, and/or a short-range (SR) communication interface 180. The auxiliary I/O interface 200 may include a USB (universal serial bus) interface, a serial interface, a MMC (multimedia card) interface and related interface technologies/standards, and any other standardized or proprietary data communication bus technology, whereas the short-range communication interface radio frequency (RF) low-power interface 180 may include WLAN (wireless local area network) and Bluetooth communication technology or IRDA (infrared data access) interfaces. Moreover, the auxiliary I/O interface 200 as well as the short-range communication interface 180 may each represent one or more interfaces supporting one or more input/output interface technologies and communication interface technologies, respectively. The operating system, specific device software applications or modules, or parts thereof, may be temporarily loaded into a volatile memory 150 such as a random access memory (typically implemented on the basis of DRAM (direct random access memory) technology for faster operation). Moreover, received communication signals may also be temporarily stored to volatile memory 150, before permanently writing them to a file system located in the non-volatile memory 140 or any mass storage preferably detachably connected via the auxiliary I/O interface for storing data. The present invention is not limited to these specific components and their implementation depicted merely for illustration and for the sake of completeness.

Additionally, the electronic device 1 may be equipped with a module for scalable encoding 105 and scalable decoding 106 of video data. By means of the CPU 100 the modules 105, 106 may individually be used. However, the electronic device 1 is adapted to perform video data encoding or decoding respectively. The video data may be received by means of the communication modules of the device or it also may be stored within any imaginable storage means within the electronic device 1. The components discussed in relation to the electronic device 1 may be implemented using the configuration 40 shown in FIG. 4. Some of the components may be implemented using the configuration 40 shown in FIG. 4, while other components may be implemented with other constructions. In addition, the components of the electronic device 1 shown in FIG. 9 may be implemented using the configuration 40 shown in FIG. 4 independently from the electronic device 1, and embodiments of the invention are not limited to implementations that include the electronic device 1. The configuration 40 shown in FIG. 4 may also be used in other electronic devices and applications that employ electronic circuits and other circuitry components.

It is to be understood that the above-described arrangements are only illustrative of the application of the principles of the present invention. Numerous modifications and alternative arrangements may be devised by those skilled in the art without departing from the scope of the present invention. A person skilled in the art will understand that the steps and signals of the present application represent general cause-and-effect relationships that do not exclude intermediate interactions of various types, and will further understand that the various steps and structures described in this application can be implemented by a variety of different sequences and configurations, using various combinations of hardware and software which need not be further detailed herein.

The invention claimed is:

1. An apparatus, comprising:
a nanoscale material layer; and
a programmable element in close proximity to at least a first section of the nanoscale material layer;
wherein the programmable element is programmable to a first state to interfere with an electron wave in at least the first section of the nanoscale material layer in a first manner, and programmable to a second state to interfere with the electron wave in a second manner.

2. The apparatus of claim 1, wherein the nanoscale material layer comprises a layer of graphene.

3. The apparatus of claim 2, further comprising a first contact coupled to a first edge of the layer of graphene, and a second contact coupled to a second edge of the layer of graphene.

4. The apparatus of claim 1, wherein the first state or the second state of the programmable element comprises a first nanoscale charge distribution.

5. The apparatus of claim 4, wherein the interference from the first nanoscale charge distribution is configured to produce a metallic state in at least the first section of the layer of graphene.

6. The apparatus of claim 4, wherein the interference from the first nanoscale charge distribution is configured to produce a semiconducting state in at least the first section of the layer of graphene.

7. The apparatus of claim 4, wherein the interference from the first nanoscale charge distribution is configured to produce an insulating state in at least the first section of the layer of graphene.

8. The apparatus of claim 4, wherein the programmable element is dynamically reconfigurable from the first state to the second state.

9. The apparatus of claim 4, wherein the first state or the second state comprises a second nanoscale charge distribution.

10. The apparatus of claim 4, wherein the first nanoscale charge distribution is printed on the programmable element by a laser printer.

11. The apparatus of claim 4, wherein the first nanoscale charge distribution is a periodic electric charge distribution.

12. The apparatus of claim 4, wherein the first nanoscale charge distribution is printed on the programmable element by e-beam lithography.

13. The apparatus of claim 6, wherein the semiconducting state is n-type.

14. The apparatus of claim 6, wherein the semiconducting state is p-type.

15. The apparatus of claim 1, wherein the programmable element comprises an insulator material.

16. The apparatus of claim 1, wherein the nanoscale material layer comprises a layer of homogenous magnetic tunnel junctions.

17. The apparatus of claim 16, wherein the programmable element comprises an applied magnetic field.

18. The apparatus of claim 16, wherein the interference from the applied magnetic field is configured to produce a metallic state in at least the first section of the layer of homogenous magnetic tunnel junctions.

19. The apparatus of claim 16, wherein the interference from the applied magnetic field is configured to produce a semiconducting state in at least the first section of the layer of homogenous magnetic tunnel junctions.

20. The apparatus of claim 16, wherein the interference from the applied magnetic field is configured to produce an insulating state in at least the first section of the layer of homogenous magnetic tunnel junctions.

21. The apparatus of claim 16, wherein the applied magnetic field is dynamically reconfigurable.

22. A method, comprising:
providing a nanoscale material layer; and
providing a programmable element in close proximity to at least a first section of the nanoscale material layer;
wherein the programmable element is programmable to a first state to interfere with an electron wave in at least the first section of the nanoscale material layer in a first manner, and programmable to a second state to interfere with the electron wave in a second manner.

23. The method of claim 22, wherein the nanoscale material layer comprises a layer of graphene.

24. The method of claim 22, further comprising providing the programmable element with a first nanoscale charge distribution corresponding to either the first state or the second state.

25. The method of claim 24, wherein the interference from the first nanoscale charge distribution is configured to produce a metallic state in at least the first section of the layer of graphene.

26. The method of claim 24, wherein the interference from the first nanoscale charge distribution is configured to produce a semiconducting state in at least the first section of the layer of graphene.

27. The method of claim 24, wherein the interference from the first nanoscale charge distribution is configured to produce an insulating state in at least the first section of the layer of graphene.

28. The method of claim 24, further comprising reconfiguring the programmable element from the first state to the second state.

29. The method of claim 24, further comprising providing the first state or the second state with a second nanoscale charge distribution.

30. The method of claim 24, further comprising printing the first nanoscale charge distribution on the programmable element by a laser printer.

31. The method of claim 24, further comprising printing the first nanoscale charge distribution on the programmable element by e-beam lithography.

32. The method of claim 24, wherein the first nanoscale charge distribution is a periodic electric charge distribution.

33. The method of claim 22, wherein the nanoscale material layer comprises a layer of homogenous magnetic tunnel junctions.

34. The method of claim 22, wherein the programmable element comprises an applied magnetic field.

35. An electronic device, comprising:
a reconfigurable circuitry component comprising:
a nanoscale material layer; and
a programmable element in close proximity to at least a first section of the nanoscale material layer comprising a first nanoscale charge distribution, wherein the programmable element is programmable to a first state to interfere with an electron wave in at least the first section of the nanoscale material layer in a first manner, and programmable to a second state to interfere with the electron wave in a second manner, and
a processing component configured to dynamically change the first nanoscale charge distribution to a second nanoscale charge distribution.

36. The electronic device of claim 35, wherein the nanoscale material layer comprises a layer of graphene.

37. A computer readable storage medium embedded with a computer program, comprising programming code for:
receiving instructions to erase a first nanoscale charge distribution from a programmable element,
erasing the first nanoscale charge distribution from the programmable element, and
writing a new nanoscale charge distribution to the programmable element,
wherein the programmable element is in close proximity to at least a first section of a nanoscale material layer.

* * * * *